United States Patent

Long

[15] 3,693,107

[45] Sept. 19, 1972

[54] STABLE POWER AMPLIFIER CIRCUIT

[72] Inventor: Ernest L. Long, Tempe, Ariz.

[73] Assignee: Motorola Inc., Franklin Park, Ill.

[22] Filed: Nov. 2, 1970

[21] Appl. No.: 79,004

[52] U.S. Cl. ..........................330/17, 330/22, 330/26
[51] Int. Cl. ..................................................H03f 3/18
[58] Field of Search .....330/13, 15, 17, 18, 22, 38 M, 330/26

[56] References Cited

UNITED STATES PATENTS

| | | | |
|---|---|---|---|
| 3,526,846 | 9/1970 | Campbell | 330/18 X |
| 3,573,645 | 4/1971 | Wheatley, Jr. | 330/15 |

*Primary Examiner*—Roy Lake
*Assistant Examiner*—Lawrence J. Dahl
*Attorney*—Mueller & Aichele

[57] ABSTRACT

An integrated circuit power amplifier utilizes a quasi-complementary power output stage incorporating an NPN Darlington amplifier for one section and a field-aided lateral PNP transistor cascaded to an NPN Darlington amplifier for the other section. Feedback from the amplifier output terminal to an intermediate stage coupled to the input of the power output stage is separated into DC and AC feedback paths. The biasing of the power output stage includes an epitaxial resistance matched to the field-aided transistor bulk resistance to cancel the effect of the bulk resistance for improved output stage thermal stability.

7 Claims, 2 Drawing Figures

PATENTED SEP 19 1972 3,693,107

INVENTOR.
ERNEST L. LONG
BY Mueller & Aichele
ATTORNEYS.

STABLE POWER AMPLIFIER CIRCUIT

BACKGROUND OF THE INVENTION

In the fabrication of a monolithic power amplifier circuit, design problems are encountered primarily due to process limitations. Typically, only NPN transistors, diffused resistors, and PNP transistors with limited performance characteristics have been available. A power amplifier utilizing all NPN transistors is the most capable of realization in integrated circuit form but such a circuit has asymmetric voltage gain with poor negative swing performance which is difficult to improve without utilizing excessive bias currents.

An output stage having relatively satisfactory overall characteristics (simplified biasing and good linearity) is a complementary common-collector class AB output stage. In discrete versions, such a power amplifier is easily realized. Because of the lack of a high current PNP transistor in present monolithic technology, the PNP power transistor must be simulated by using a lateral PNP transistor and two NPN power transistors in a composite connection. The difficulty in using such a composite PNP transistor stage is that the phase shift through the lateral PNP transistor permits only a small overall loop transmission. This limits the performance of the amplifier. The time delay through the lateral PNP transistor also causes the local loop of the composite connection to have a vary poor gain and phase margin.

In the construction of a monolithic power amplifier circuit it also is desirable to provide for feedback within the integrated circuit itself without necessitating the use of external feedback connections. Such feedback circuitry should be capable of independent adjustment of AC and DC feedback in order to obtain the optimum operating characteristics of the amplifier.

SUMMARY OF THE INVENTION

Accordingly, it is an object of this invention to provide an improved power amplifier circuit.

It is an additional object of this invention to provide an improved monolithic integrated circuit power amplifier.

It is a further object of this invention to fabricate a monolithic integrated circuit power amplifier with a quasi-complementary power output stage utilizing a field-aided lateral PNP transistor.

In accordance with a preferred embodiment of this invention, the amplifier in a monolithic integrated circuit form, and the power output stage utilizes an NPN power transistor section and a field-aided lateral PNP transistor coupled with an NPN power transistor section for the two halves of the power amplifier output stage. Biasing for the field-aided PNP transistor is obtained from a current source coupled in series with a biasing circuit, which includes a resistance for compensating for and cancelling the effect of the bulk resistance of the field-aided transistor from the biasing circuit. Specifically, the resistance used for cancelling the bulk resistance effect of the field-aided transistor is formed from the epitaxial layer of the integrated circuit, so that the processing and thermal characteristics of the compensating and bulk resistances are matched.

DETAILED DESCRIPTION

Figure 1:
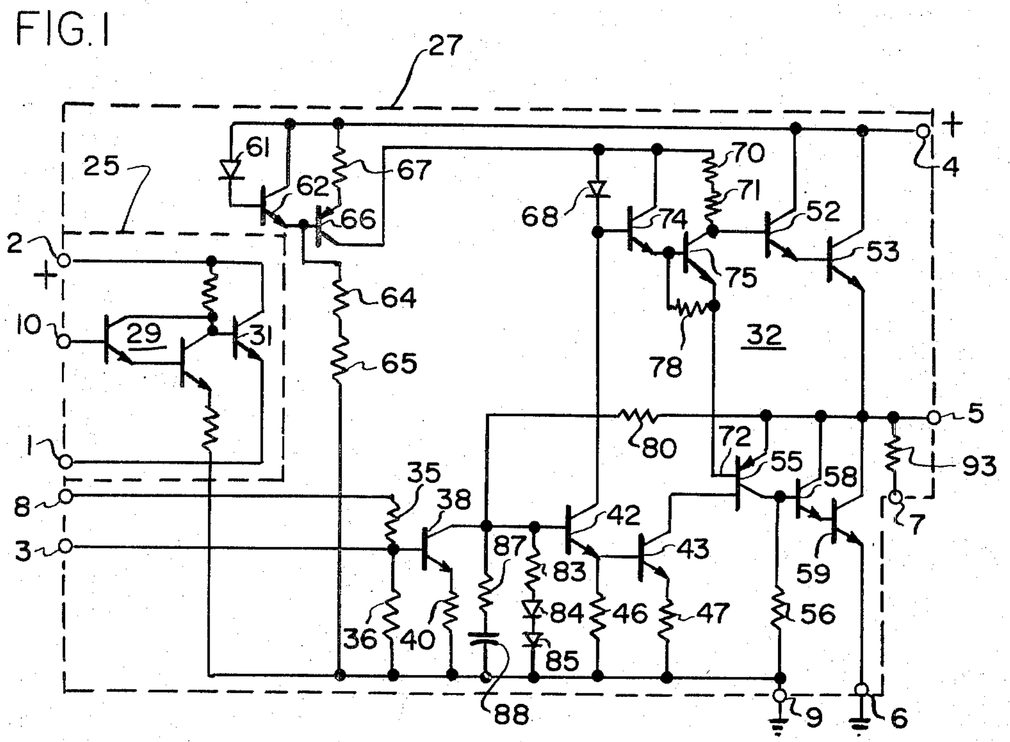
FIG. 1 is a detailed schematic diagram of a preferred embodiment of this invention.
Figure 2:
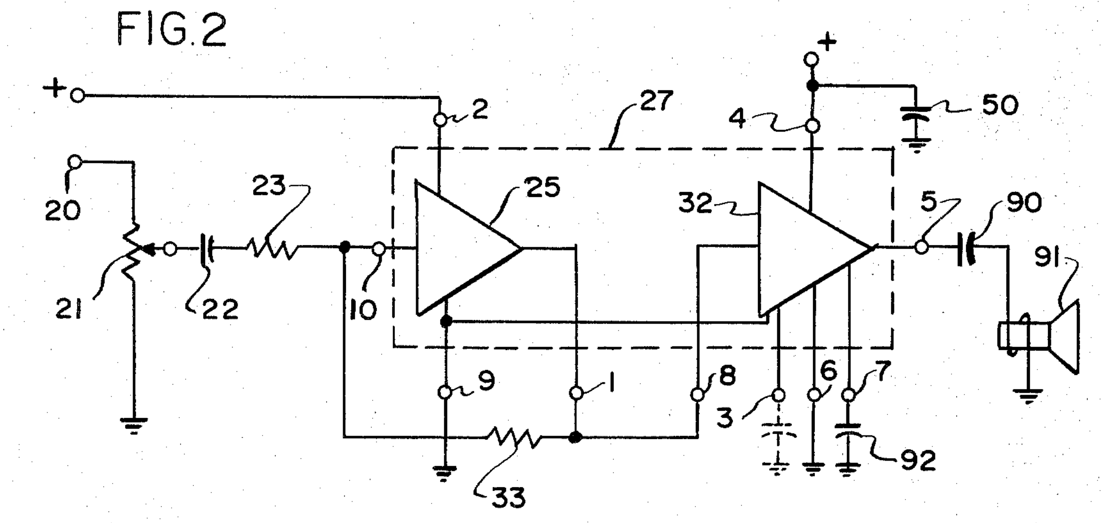
FIG. 2 is a diagram showing the external connections to the circuit shown in FIG. 1.

Referring now to the drawings, it should be noted that the circuit enclosed in the dotted lines in FIG. 1 is fabricated as a single monolithic integrated circuit. This circuit may be provided as an independent circuit as shown in FIG. 1 or may be incorporated into part of a larger integrated circuit configuration including additional components with which the amplifier circuit of FIG. 1 may be operated. The circuit shown in FIG. 1 includes 10 bonding pads or output pins which are numbered, respectively, from 1 to 10. In FIG. 2 these same bonding pads or output pins are similarly numbered to indicate the external connections which may be made to the circuit of FIG. 1, which is indicated in block form in FIG. 2.

In conjunction with the circuit shown in FIG. 1, a transistor known as a field-aided lateral PNP transistor is employed as part of the output stage of the power amplifier. This transistor has performance characteristics ($h_{fe}$ and $f_t$) which are significantly better than the conventional lateral PNP transistors normally employed in monolithic integrated circuits. Two basic mechanisms are used to improve the transistor performance. Both result from an electric field which is set up in the base region by applying a biasing voltage between two N+ contacts in the N—epitaxial (base) layer and located just beyond the P—emitter and the P—collector diffusions. This establishes a lateral voltage drop under the emitter which causes the bottom and remote emitter edges to be debiased. Therefore, emission is only from the edge nearest the collector. This prevents vertical diode action and also reduces the effective base width. In addition the minority carriers are accelerated through the base width by drift action because of this field.

Experimental results indicate an improvement in the cutoff frequency $f\alpha$, so that the field-aided lateral PNP transistor has a frequency response which is much improved over that of a conventional lateral PNP transistor. Similarly, the current gain, $h_{fe}$, also is increased due to the electric field. Measured current gain $h_{fe}$ for such a field-aided lateral PNP transistor has shown an increase by a factor greater than 20 for experimental devices which have been tested when compared with conventional lateral PNP transistors.

Referring initially to FIG. 2, input signals for the circuits shown in FIGS. 1 and 2 are applied to an input terminal 20, which is connected to receive the audio frequency signals from the earlier stages of an audio system. Since the particular circuit configuration of such earlier stages is of no significance with respect to the circuit shown in FIGS. 1 and 2, no such showing of these stages of the audio system is made in order to simplify this disclosure. The signals present on the terminal 20 are applied across a potentiometer 21, connected between ground and the terminal 20, and are coupled through a coupling capacitor 22 and an input resistor 23 to the bonding pad 10, providing the input to a preamplifier section 25 of the integrated circuit amplifier 27.

As most clearly shown in FIG. 1, the preamplifier section 25 is a two-stage amplifier, employing an NPN Darlington stage 29, with the base of the input transistor of the Darlington 29 being connected to the bonding pad 10 for receiving the input signals. The output of the Darlington stage 29 is connected to the base of an NPN amplifier transistor 31, operated as an emitter-follower with the signals present on the emitter thereof being coupled to the bonding pad 1. As shown in FIG. 2, the bonding pad 1 is connected externally to the bonding pad 8, providing the input for a power amplifier section 32 of the amplifier circuit 27. Operating potential for the preamplifier section 25 is provided on bonding pad 2 and may be obtained from portions of the audio system, not shown, or may be obtained from the power supply for the other portions of the circuit shown in FIG. 1.

A feedback resistor 33 is connected between bonding pads 1 and 10, and the resistors 23 and 33 determine the voltage gain of the preamplifier circuit. The DC coupling of the output of the preamplifier section 25 to the input of the power amplifier section 32 is completed through a pair of input resistors 35 and 36 connected between the bonding pad 8 and the bonding pad 9, which is connected in turn to ground. This DC coupling of the preamplifier section 25 to the power amplifier section 32 through the resistors 35 and 36 partially compensates for temperature variations and corresponding output DC voltage variations, at a small loss in gain caused by the signal loss across the resistor 35.

Input signals appearing at the junction of the resistors 35 and 36 are amplified in a first amplifying stage, consisting of an NPN transistor 38, the base of which is connected to the junction of the resistors 35 and 36, and the emitter of which is connected through a resistor 40 to the ground bonding pad 9. The amplified signals appearing on the collector of the transistor 38 are connected to the base of a first NPN driver transistor 42, the emitter of which is connected to the base of a second NPN driver transistor 43, with the emitters of the transistors 42 and 43 also being connected to the ground bonding pad 9 through emitter resistors 46 and 47, respectively. The transistors 42 and 43 constitute a Darlington amplifier stage, insofar as AC signals are concerned, since the same AC signal appears on the base of the transistor 42 as appears on the base of the transistor 43. This AC Darlington amplifier stage 42, 43 then constitutes an intermediate or driving amplifier stage for the power amplifier section 32.

The power amplifier output stage of the circuit is comprised of first and second sections connected between the operating voltage supply bonding pad 4 and the bonding pad 6, which also is connected to ground. Operating potential is applied to the bonding pad 4 and is filtered to remove ripple therefrom by means of a filter capacitor 50 (FIG. 2). The first or positive section of the power amplifier stage is an NPN Darlington amplifier consisting of a pair of NPN power transistors 52 and 53. The collectors of the transistors 52 and 53 are connected to the bonding pad 4; and the emitter of the transistor 53, comprising the output of this section of the power amplifier, is connected to the output bonding pad 5, which is the output terminal of the circuit.

In order to provide a quasi-complementary power output stage, a PNP power transistor is simulated by utilizing a field-aided lateral PNP transistor 55, the emitter of which is connected to the power amplifier output bonding pad 5, and the base of which is connected to the collector of the transistor 43 which supplies amplified audio signals to the power amplifier output stage. Completion of the operating circuit for the PNP transistor 55 is made by connecting the collector of the transistor 55 to ground, bonding pad 9 through a collector load resistor 56. The collector of the transistor 55 also is connected to the base of an NPN power transistor 58, which is cascaded in a Darlington amplifier configuration with another NPN power transistor 59, the collectors of the transistors 58 and 59 being connected to the output bonding pad 5, and the emitter of the transistor 59 being connected to the ground bonding pad 6. The power output sections of the amplifier 27 operate as a quasi-complementary push-pull amplifier, with the amplified output appearing on the bonding pad 5.

Operating and bias currents for the amplifier section 32 is obtained from the DC potential applied to the bonding pad 4 through a biasing circuit including a diode 61, an NPN transistor 62 and a pair of resistors 64 and 65. The diode 61 preferably is formed from the emitter-base junction of an NPN transistor having the collector shorted to the base to form the anode of the diode. The anode of the diode 61 and the collector of the transistor 62 are connected together at the bonding pad 4, with the cathode of the diode 61 connected to the base of the transistor 62. Completion of the biasing circuit is obtained by connecting the series-connected resistors 64 and 65 between the ground bonding pad 9 and the emitter of the transistor 62, so that the potential appearing on the emitter of the transistor 62 is a substantially constant offset voltage from that appearing on the bonding pad 4 and corresponds to the voltage across two base-emitter junctions (20). This regulated voltage is applied to the base of a lateral PNP current source transistor 66, the emitter of which is connected through a resistor 67 to the bonding pad 4. Since the PNP transistor is driven by the NPN transistor 62, the voltage present across the resistor 67 is equal to the voltage drop 10 to establish a constant current through the resistor 67 and the transistor 66 equal to 0/R67.

It is desirable to provide a class AB output biasing for the two sections of the power amplifier comprising the transistors 52, 53 and transistors 55, 58, 59 respectively. To accomplish this, a resistor-diode-transistor biasing network is employed and develops a biasing voltage between the base of the field-aided lateral PNP transistor 55 and the base of the NPN power transistor 52, with a magnitude and proper temperature coefficient to provide the desired class A bias.

A bias determining resistor 70 and a lateral bulk resistance cancelling resistor 71 are connected in series between the collector of the current source transistor 66 and the base of the NPN power transistor 52. The resistor 71 is formed from the N-epitaxial material of the integrated circuit, since this is the same material which forms the bulk base resistance $R_{bulk}$ of the field-aided lateral PNP transistor 55. This base bulk resistance has not been shown in the drawing of FIG. 1 but is inherent in the transistor and acts as a resistance in series with the base terminal 72 for the field-aided transistor 55.

Completion of the biasing circuit is accomplished by means of a first NPN emitter-follower transistor 74, the collector of which is connected to the collector of the current source transistor 66, and the base of which is connected to the junction of a diode 68, connected across the collector-base of the transistor 74, and the collector of the transistor 42. The emitter of the transistor 74 in turn is coupled to the base of an additional NPN transistor 75, the collector of which is connected to the junction of the base of transistor 52 with the resistor 71, and the emitter of which is connected to the biasing terminal 72 at the base of the field-aided transistor 55.

From an examination of this circuit shown in FIG. 1, it is apparent that the potential difference V (bias DC), between the potential on the base of the transistor 52 and that applied to the biasing terminal 72 of the transistor 55 may be expressed as follows:

$$V(\text{bias DC}) = 30 - I_0(R70 + R71) + I_0 R_{bulk} \quad (1)$$

where the 30 voltage drop is that which takes place from the collector of the current source transistor 66 across the diode 68 (fabricated in the same manner as the diode 61) and the base-emitter diode junctions of the transistors 74 and 75, and $I_0$ is the current flowing from the collector of the transistor 66.

The current $I_0$, however, also may be expressed as $I_0 = 0/R67$, and substituting this value for $I_0$ in equation (1) gives:

$$V(\text{bias DC}) = 30 - (0/R67)(R70 + R71 - R_{bulk}) \quad (2)$$

Examination of equation (2) indicates that if the resistance of resistor 71 is selected to be equal to the resistance $R_{bulk}$, the terms provided by these resistance cancel from the equation, leaving:

$$V(\text{bias DC}) = 30 - 0\,R70/R67. \quad (3)$$

By fabricating the resistance R71 from the epitaxial layer of the integrated circuit, the cancellation of the bulk resistance of the field-aided lateral PNP transistor from the biasing circuit also is made to be independent of temperature and processing variations for the circuit.

By referencing the current $I_0$, to the base-emitter junctions of the diode 61 and the transistor 62, the current has a negative temperature coefficient, and the requirement for the base drive of the power transistor 52 also has a negative temperature. Even though the two temperature coefficients do not exactly match, the negative temperature coefficient of the reference current does decrease the value of current which is required to insure the full output capability independent of temperature. Another advantage is that the current $I_0$ is independent of the magnitude of the supply voltage so that full load current can be obtained even at a low supply voltages.

Alternating current and direct current feedback for the amplifier circuit shown in FIG. 1 is obtained by connecting a feedback resistor 80 between the power amplifier output bonding pad 5 and the junction of the collector of the transistor 38 with the base of the transistor 42. The DC output quiescent voltage for the circuit is established primarily by the resistors 35 and 36 with DC feedback control being primarily determined by the relative magnitudes of the resistances of the resistors 40 and 80. The DC quiescent output voltage should be established approximately at the mid-point of the voltage present on the bonding pad 4.

In order to separate or isolate the AC feedback from the DC feedback, an additional resistor 83 is connected in series with a pair of diodes 84 and 85 between the junction of the transistor collector 38 and the base of the transistor 42 and the ground bonding pad 9. The diodes 84 and 85 are NPN transistor diodes made in a manner similar to the diode 61 and produce a voltage drop thereacross equal to 20 (the voltage drop present across two base-emitter junctions). Thus, the lower end of the resistor 83 is placed at a potential which is 20 above the ground potential present on the bonding pad 9. An examination of the circuit shown in FIG. 1 also reveals that the upper end of the resistor 84 is connected through two base-emitter diode junctions of the transistors 42 and 43 and the resistor 47 to the ground bonding pad 9. The value of the resistance of the resistor 47 is much less than the input impedance of the Darlington stage 42, 43; so that the DC potential present at both ends of the resistor 83 is substantially the same. Thus, with the value of the resistor 83 also being much greater (an order of magnitude) than the value of resistance of the resistor 47, substantially no DC feedback takes place through the resistor 83. The diodes 84 and 85 appear as a battery insofar as DC feedback is concerned.

The resistor 83 however, is in the AC feedback circuit between the output bonding pad 5 and ground bonding pad 9, and the relative values of the resistors 83 and 80 determine the particular amount of AC feedback which is provided by the circuit. Adjustment of these relative values, varies the AC feedback to the desired amount.

An additional resistor 87, connected in series with a capacitor 88 is connected between the ground bonding pad 9 and the junction of the collector of the transistor 38 with the base of the transistor 42 operates as a roll-off filter to improve the high frequency stability of the circuit. The capacitor 88, of course, blocks any DC feedback, so that the only effective DC feedback from the output bonding pad 5 is through the collector-emitter path of the transistor 38 and the resistor 40.

The output signals from the output bonding pad 5 of the circuit shown in FIG. 1 then may be applied through a suitable coupling capacitor 90 to a loudspeaker 91, shown in FIG. 2. A capacitor 92 may be connected between ground and the bonding pad 7, which is coupled to the output bonding pad 5 through a resistor 93, in order to provide high frequency compensation operation for the circuit. In addition, roll-off filter capacitor may be connected between the bonding pad 3 and ground, effectively placing such a roll-off capacitor in parallel with the input resistor 36 connected between the ground bonding pad 9 and the base of the input transistor 38.

I claim

1. An integrated circuit power amplifier including in combination:

an NPN power transistor stage having at least a first NPN transistor with base, collector, and emitter electrodes;

a PNP power transistor stage including a field-aided lateral PNP input transistor having base, base-bias, collector and emitter electrodes and having an inherent bulk resistance and including at least a second NPN transistor having base, collector and emitter electrodes, the emitter electrode of the field-aided PNP transistor being connected with the collector electrode of the second NPN transistor and the collector electrode of the field-aided PNP transistor being connected with the base electrode of the second NPN transistor;

means interconnecting the emitter electrode of the first NPN transistor and the collector electrode of the second NPN transistor with a common terminal to form an output terminal for the power amplifier;

first and second voltage supply conductors, the collector electrode of the first NPN transistor being connected with the first supply conductor and the emitter electrode of the second NPN transistor being connected with the second supply conductor;

bias circuit means connected to the base of the first NPN transistor and the base-bias electrode of the field-aided lateral PNP transistor for establishing a predetermined operating bias voltage between the base of the first NPN transistor and the base-bias electrode of the field-aided lateral PNP transistor; and means coupled with the bias circuit means for cancelling the effect of the field-aided transistor bulk resistance on the bias voltage.

2. The combination according to claim 1 wherein the cancelling means comprises a first resistance means matched to the characteristics of the bulk resistance of the field-aided lateral PNP transistor, and the bias circuit means comprises a current source, a diode, and a biasing transistor having base, collector and emitter electrodes; the current source and the first resistance means connected in series, in the order named, between the first supply conductor and and the base of the first NPN transistor, the collector electrode of the biasing transistor being coupled with the base electrode of the first NPN transistor, and the emitter electrode of the biasing transistor being coupled with the base-bias electrode of the field-aided lateral PNP transistor, the diode being connected in a circuit in a forward current conducting direction between the current source and the base electrode of the biasing transistor.

3. The combination according to claim 1 wherein the first NPN transistor comprises a first pair of NPN transistors connected in a Darlington amplifier configuration and wherein the second NPN transistor comprises a second pair of NPN transistors connected in a Darlington amplifier configuration.

4. The combination according to claim 2 wherein the biasing transistor includes a plurality of transistors connected in cascade to provide a predetermined number of base-emitter junctions between the diode and the base-bias electrode of the field-aided lateral PNP transistor, the number of said base-emitter junctions determining the biasing voltage between the base electrode of the first NPN transistor and the base-bias electrode of the field-aided lateral PNP transistor.

5. The combination according to claim 2 wherein the first resistance means is formed from the same layer of the integrated circuit used to form the base of the field-aided lateral PNP transistor.

6. The combination according to claim 2 further including second resistance means connected in series with the first resistance means between the current source and the base electrode of the first NPN transistor.

7. The combination according to claim 2 wherein the current source is referenced to the voltage drop across a predetermined number of transistor base-emitter junctions.

* * * * *